United States Patent
Huang et al.

(10) Patent No.: US 11,335,513 B2
(45) Date of Patent: May 17, 2022

(54) PASSIVATION OF DEFECTS IN PEROVSKITE MATERIALS FOR IMPROVED SOLAR CELL EFFICIENCY AND STABILITY

(71) Applicant: NUtech Ventures, Lincoln, NE (US)

(72) Inventors: Jinsong Huang, Lincoln, NE (US); Xiaopeng Zheng, Lincoln, NE (US)

(73) Assignee: NUTECH VENTURES, Lincoln, NE (US)

( * ) Notice: Subject to any disclaimer, the term of this patent is extended or adjusted under 35 U.S.C. 154(b) by 0 days.

(21) Appl. No.: 16/542,712

(22) Filed: Aug. 16, 2019

(65) Prior Publication Data
US 2020/0035418 A1 Jan. 30, 2020

Related U.S. Application Data

(63) Continuation of application No. PCT/US2018/018706, filed on Feb. 20, 2018.
(Continued)

(51) Int. Cl.
*H01G 9/20* (2006.01)
*H01L 51/00* (2006.01)
(Continued)

(52) U.S. Cl.
CPC ......... *H01G 9/2009* (2013.01); *H01G 9/0036* (2013.01); *H01G 9/2018* (2013.01); *H01G 9/2059* (2013.01); *H01L 51/0003* (2013.01); *H01L 51/0046* (2013.01); *H01L 51/0077* (2013.01); *H01L 51/424* (2013.01); *H01L 51/4213* (2013.01); *H01L 51/4253* (2013.01);
(Continued)

(58) Field of Classification Search
CPC .. H01G 9/2009; H01G 9/2059; H01G 9/0036; H01G 9/2018; H01L 51/424; H01L 51/0003; H01L 51/0077; H01L 51/4253; H01L 51/442; H01L 51/448; H01L 51/4213; H01L 51/0046; H01L 51/0035; H01L 51/0072; H01L 2251/301; H01L 2251/308; Y02E 10/549; Y02E 10/542
See application file for complete search history.

(56) References Cited

U.S. PATENT DOCUMENTS 7,220,914 B2  5/2007  Chittibabu et al.
8,680,542 B2  3/2014  Kurata et al.
(Continued)

OTHER PUBLICATIONS

Aldeman, Improving Solar Cell Performance Through Surface Modification of Silicon, University of Southampton, Thesis, Mar. 2013 (Year: 2013).*

(Continued)

*Primary Examiner* — Devina Pillay
(74) *Attorney, Agent, or Firm* — Leydig, Voit & Mayer, Ltd.; Gerald T. Gray

(57) ABSTRACT

Semiconductor devices, and methods of forming the same, include a cathode layer, an anode layer, and an active layer disposed between the cathode layer and the anode layer, wherein the active layer includes a perovskite layer. A passivation layer is disposed directly on a surface of the active layer between the cathode layer and the active layer, the passivation layer including a layer of material that passivates both cationic and anionic defects in the surface of the active layer.

13 Claims, 8 Drawing Sheets

Related U.S. Application Data

(60) Provisional application No. 62/460,266, filed on Feb. 17, 2017.

(51) Int. Cl.
    *H01L 51/42*     (2006.01)
    *H01G 9/00*     (2006.01)
    *H01L 51/44*     (2006.01)

(52) U.S. Cl.
    CPC .......... *H01L 51/442* (2013.01); *H01L 51/448* (2013.01); *H01L 51/0035* (2013.01); *H01L 51/0072* (2013.01); *H01L 2251/301* (2013.01); *H01L 2251/308* (2013.01)

(56) References Cited

U.S. PATENT DOCUMENTS

| | | |
|---|---|---|
| 9,382,474 B2 | 7/2016 | Tang et al. |
| 9,391,287 B1 | 7/2016 | Huang et al. |
| 9,812,660 B2 | 11/2017 | Huang et al. |
| 10,199,579 B2 | 2/2019 | Huang |
| 10,622,161 B2 | 4/2020 | Huang et al. |
| 10,892,416 B2 | 1/2021 | Huang et al. |
| 2005/0008880 A1* | 1/2005 | Kunze .................. C23C 18/06 428/447 |
| 2009/0229638 A1 | 9/2009 | Yun et al. |
| 2011/0104877 A1 | 5/2011 | Kunze et al. |
| 2014/0054442 A1 | 2/2014 | Huang et al. |
| 2014/0332078 A1* | 11/2014 | Guo .................. H01L 51/424 136/261 |
| 2015/0144196 A1 | 5/2015 | Irwin et al. |
| 2016/0218307 A1 | 7/2016 | Huang et al. |
| 2016/0380125 A1* | 12/2016 | Snaith ................ H01L 31/1868 136/256 |
| 2017/0084399 A1* | 3/2017 | Vak .................... H01L 51/0036 |
| 2018/0197746 A1* | 7/2018 | Bilodeau ............... C09K 13/06 |

OTHER PUBLICATIONS

International Search Report in International Patent Application No. PCT/US2018/018706 dated May 2, 2018.

Abate et al., "Supramolecular Halogen Bond Passivation of Organic-Inorganic Halide Perovskite Solar Cells," Nano Letters, ACS Publications, American Chemical Society, Apr. 30, 2014.

Lee et al., "Lewis Acid-Base Adduct Approach for High Efficiency Perovskite Solar," Acc. Chem. Res. 2016, 49, pp. 311-319, Jan. 21, 2016.

\* cited by examiner e

PASSIVATION OF DEFECTS IN PEROVSKITE MATERIALS FOR IMPROVED SOLAR CELL EFFICIENCY AND STABILITY

CROSS-REFERENCE TO RELATED APPLICATIONS

This patent application is a continuation of PCT Application No. PCT/US2018/018706 by Huang et al., entitled "PASSIVATION OF DEFECTS IN PEROVSKITE MATERIALS FOR IMPROVED SOLAR CELL EFFICIENCY AND STABILITY," filed Feb. 20, 2018, which claims priority to U.S. Provisional Patent Application No. 62/460,266 by Huang et al., entitled "PASSIVATION OF DEFECTS IN PEROVSKITE MATERIALS FOR IMPROVED SOLAR CELL EFFICIENCY AND STABILITY," filed Feb. 17, 2017, each of which is incorporated herein by reference in its entirety.

FEDERALLY SPONSORED RESEARCH OR DEVELOPMENT

This invention was made with Government support under FA9550-16-1-0299 awarded by the Air Force Office of Scientific Research. The Government has certain rights in this invention.

BACKGROUND AND SUMMARY

The present disclosure generally provides photodetector systems and methods, and more particularly photodetector systems and methods including perovskite photoactive or photoresponsive materials.

The ionic defects at the surfaces and grain boundaries of organic-inorganic halide perovskites (OIHPs) films are detrimental to both the efficiency and stability of OIHP devices such as solar cells. There are both negatively and positively charged defects in ionic OIHPs, while generally only one type of the defects is passivated. In certain embodiments, quaternary ammonium halides (QAHs), which are B-complex vitamins, are used to effectively passivate both cationic and anionic defects of OIHPs with negative- and positive-charged components, respectively. The dual-defect passivation advantageously reduces the charge trap density and elongates the carrier recombination lifetime. The dual-defect passivation also advantageously increases open-circuit-voltage of the device with bandgap of 1.55 eV to 1.15 V, and boosts the efficiency to 21.0%. QAHs universally passivate other types of OIHPs with bandgaps ranging from 1.51 eV to 1.72 eV and advantageously increase efficiency by 10-35%. Moreover, the defect healing also significantly enhances the stability of OIHP films. The various embodiments provide a new paradigm for defects passivation to further improve both the efficiency and stability of OIHPs devices such as solar cells.

According to an embodiment, a semiconductor device is provided that typically includes a cathode layer, an anode layer, an active layer disposed between the cathode layer and the anode layer, wherein the active layer includes a perovskite layer, and a passivation layer disposed directly on a surface of the active layer between the cathode layer and the active layer, the passivation layer comprising a layer of material that passivates both cationic and anionic defects in the surface of the active layer. In certain aspects, the perovskite layer includes organometal trihalide perovskite having the formula $ABX_3$, or $A_2BX_4$, wherein A is methylammonium ($CH_3NH_3^+$), formamidinium ($H_2NCHNH_2^+$), or an alkali-metal ion (e.g., $Cs^+$, $Rb^+$), B is a metal cation, and X is a halide anion (e.g., Cl, Br, I), thiocyanate (SCN—) or a mixture thereof. In certain aspects, the layer of material comprises a quaternary ammonium halide (QAH). In certain aspects, the layer of material comprises a zwitterion molecule. In certain aspects, the layer of material comprises a choline zwitterion molecule. In certain aspects, the semiconductor device further includes a first carrier transport layer disposed between the passivation layer and the cathode; and a second carrier transport layer disposed between the active layer and the anode, the first carrier transport layer having a higher electron conductivity than the second carrier transport layer, the second buffer layer having a higher hole conductivity than the first buffer layer.

According to another embodiment, a semiconductor device is provided that typically includes a cathode layer, an anode layer, and an active layer disposed between the cathode layer and the anode layer, wherein the active layer includes an organometal trihalide perovskite having the formula $ABX_3$, or $A_2BX_4$, wherein A is methylammonium ($CH_3NH_3^+$), an alkali metal ion (e.g., $Cs^+$, $Rb^+$) or formamidinium ($H_2NCHNH_2^+$), B is a metal cation, and X is a halide anion (e.g., Cl, Br, I), thiocyanate (SCN—) or a mixture thereof. The semiconductor device also typically includes a passivation layer disposed directly on a surface of the active layer between the cathode layer and the active layer, the passivation layer including a layer of material that passivates both cationic and anionic defects in the surface of the active layer. The semiconductor device further typically includes an electron extraction layer disposed directly on the passivation layer between the passivation layer and the cathode layer, the electron extraction layer comprising a layer of $C_{60}$, a first charge transport layer comprising bathocuproine (BCP) and disposed between the electron extraction layer and the cathode, and a second charge transport layer comprising Poly[bis(4-phenyl)(2,4,6-trimethylphenyl)amine] (PTAA) and disposed between the active layer and the anode. In certain aspects, the layer of $C_{60}$ has a thickness of between about 1 nm and about 100 nm.

According to yet another embodiment, a process of forming a semiconductor device is provided. The process typically includes providing an active layer, wherein the active layer includes a perovskite material, and applying a passivation layer directly on a surface of the active layer, the passivation layer comprising a first material that passivates both cationic and anionic defects in the surface of the active layer. In certain aspects, the method also typically includes forming a cathode layer on the passivation layer. In certain aspects, the method also typically includes forming an anode layer on a side of the active layer so that the active layer is disposed between the cathode layer and the anode layer. In certain aspects, the method also typically includes forming a first carrier transport layer disposed between the passivation layer and the cathode layer, and forming a second carrier transport layer disposed between the active layer and the anode layer, the first carrier transport layer having a higher electron conductivity than the second carrier transport layer, the second carrier transport layer having a higher hole conductivity than the first carrier transport layer. In certain aspects, the first material comprises a quaternary ammonium halide (QAH) or a zwitterion molecule. In certain aspects, the perovskite material includes organometal trihalide perovskite having the formula $ABX_3$, or $A_2BX_4$, wherein A is methylammonium ($CH_3NH_3^+$), formamidinium (H$_2$NCHNH$_2^+$), or an alkali-metal ion, B is a metal cation, and X is a halide anion, thiocyanate (SCN—) or a mixture thereof.

For the various semiconductor devices, and formation processes, in certain aspects, the anode layer includes indium tin oxide (ITO) and the cathode layer includes copper. In certain aspects, the active layer has a thickness of between about 1 nm and about 10 μm. In certain aspects, the passivation layer has a thickness of between about 1 nm and about 30 nm.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE SEVERAL VIEWS OF THE DRAWING(S)

The detailed description is described with reference to the accompanying FIG.s. The use of the same reference numbers in different instances in the description and the FIG.s may indicate similar or identical items.

Figure 3A:
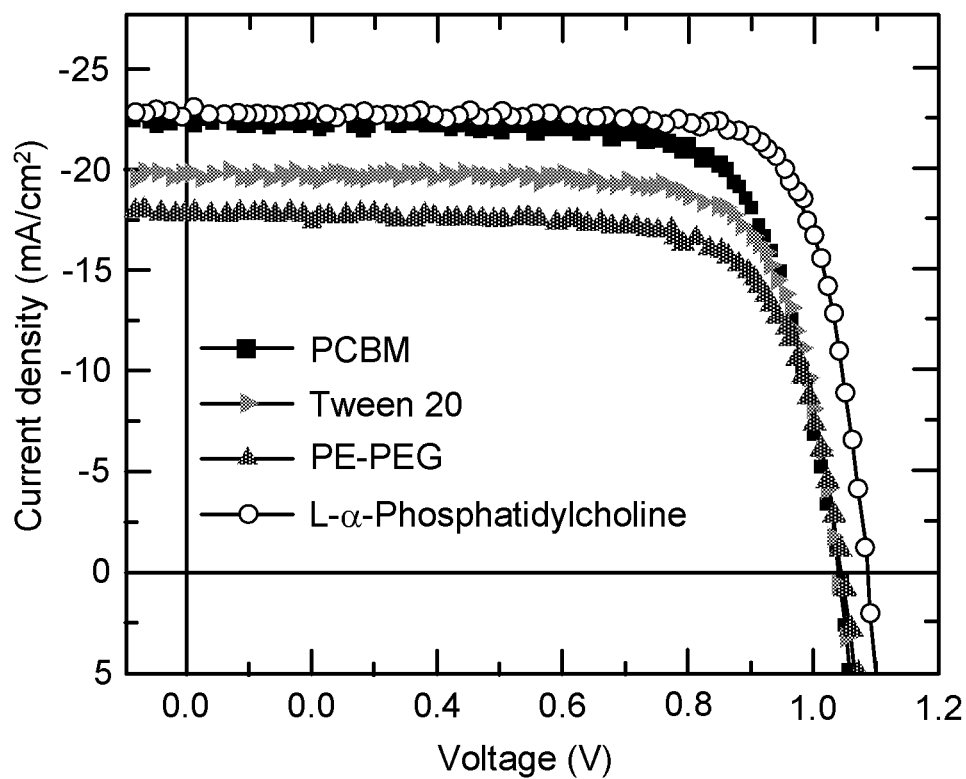
Figure 3B:
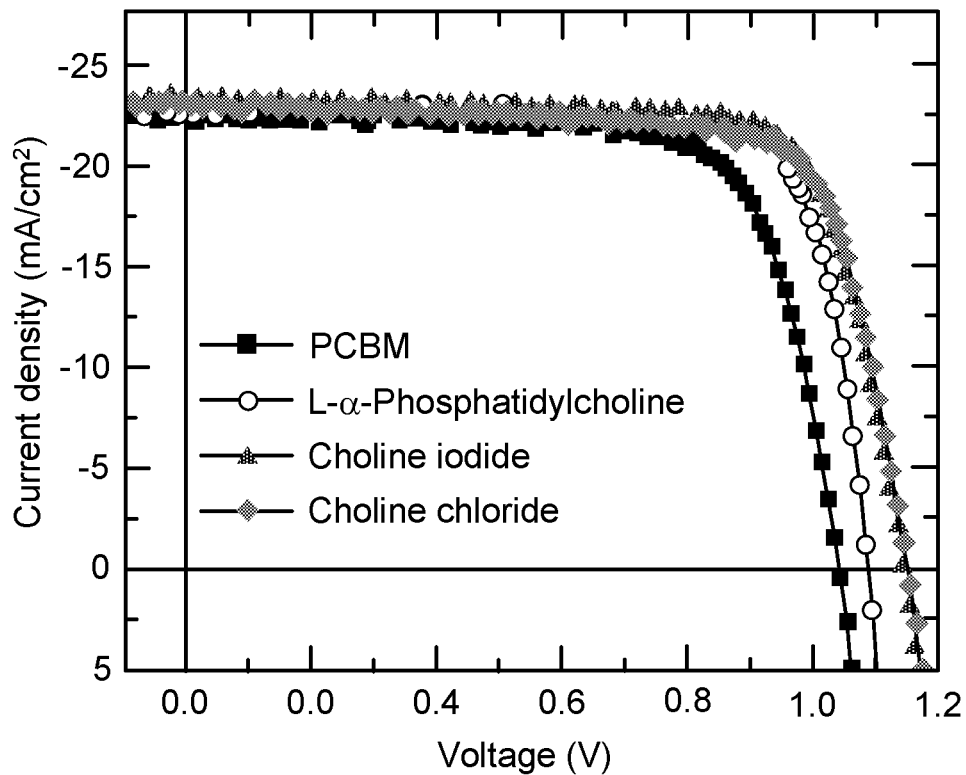
Figure 3C:
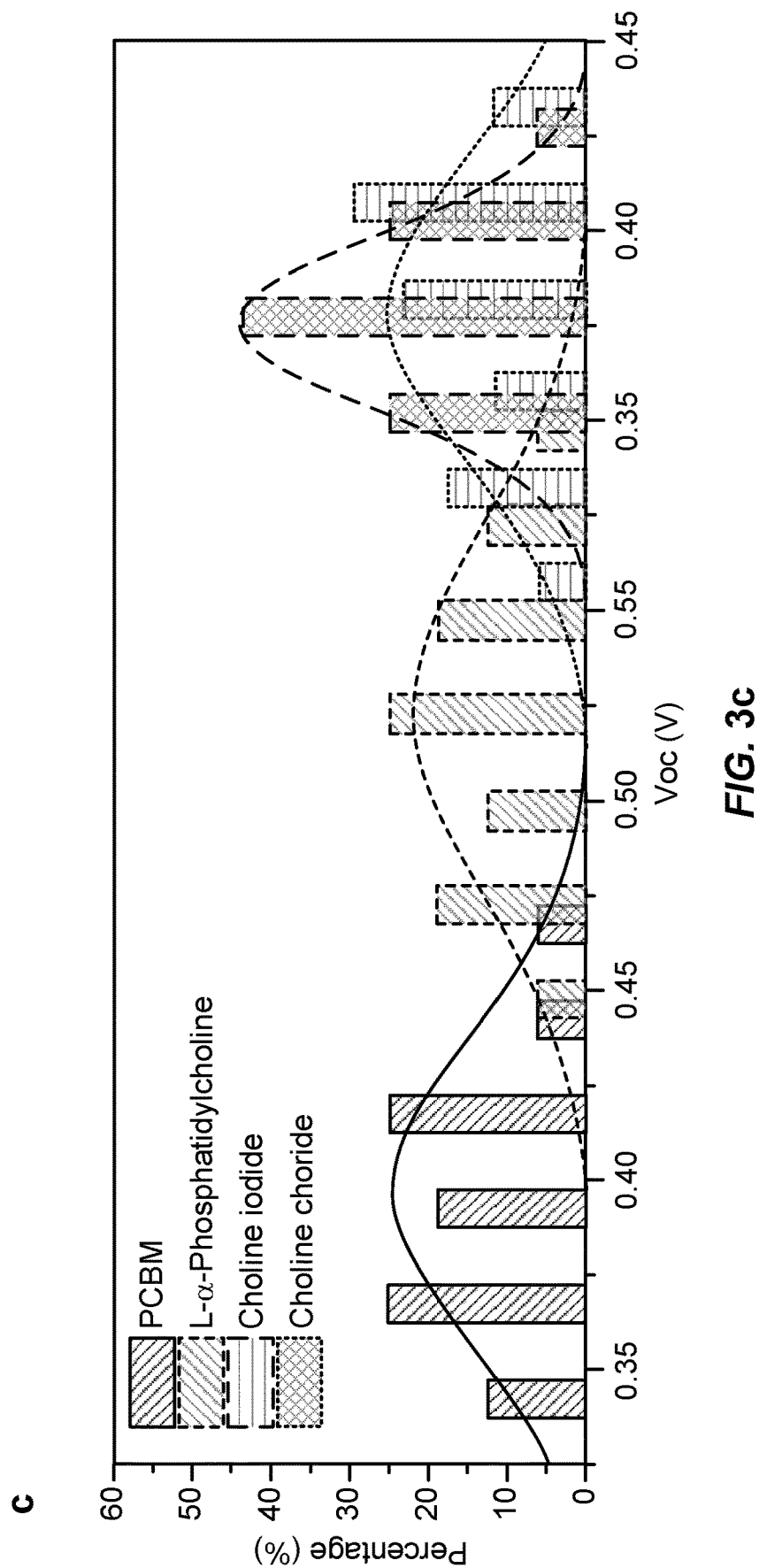

FIG. 3 shows passivation layer dependent device performance: FIG. 3a, shows current density-voltage (J-V) characteristics of two-step processed MAPbI$_3$ devices with different passivation layers; FIG. 3b shows J-V curves for the two-step processed MAPbI$_3$ devices passivated by choline chloride and choline iodide; FIG. 3c shows statistics of V$_{OC}$ distribution for devices with PCBM, L-α-Phosphatidylcholine, Choline iodide, and Choline chloride, where solid lines represent the Gauss distribution fitting for the statistic of V$_{OC}$.

Figure 4:
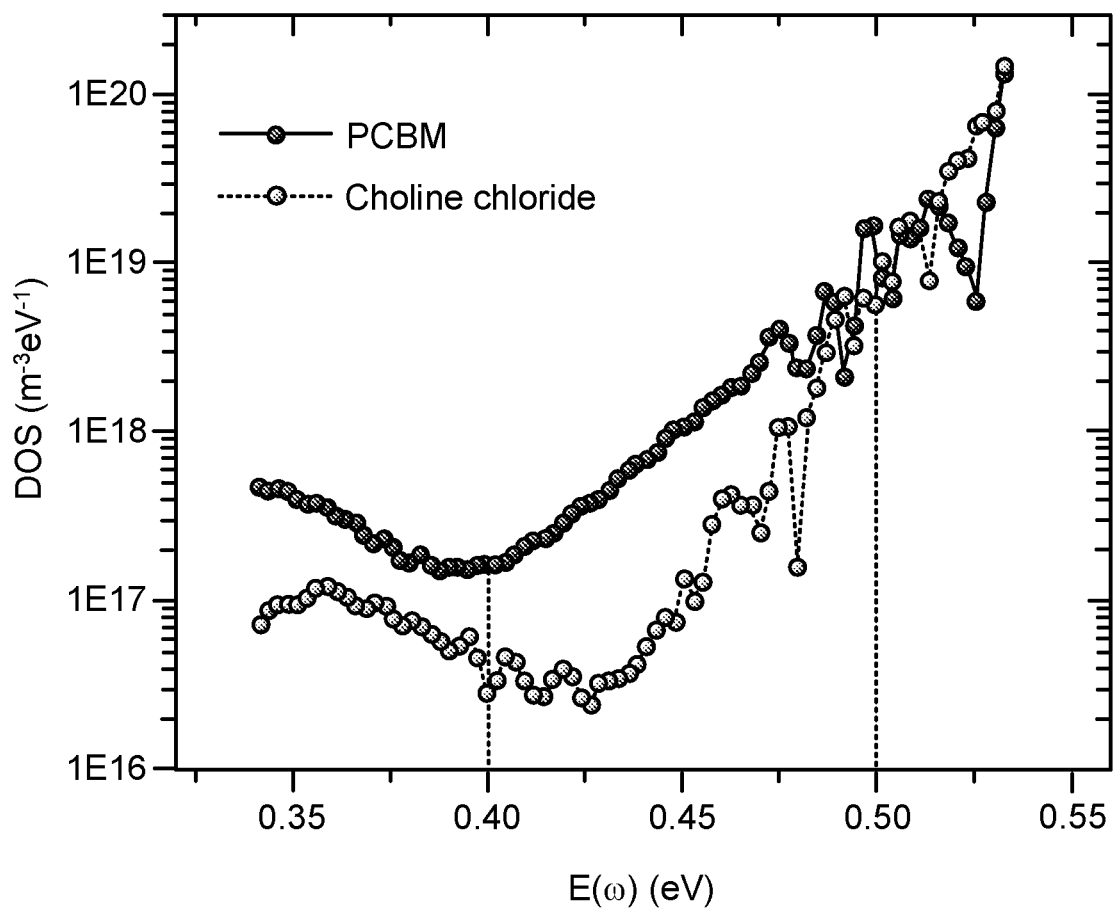

FIG. 4 shows trap density of states (tDOS) obtained by thermal admittance spectroscopy for devices with PCBM (blue), and Choline chloride passivation layers (red).

Figure 5:
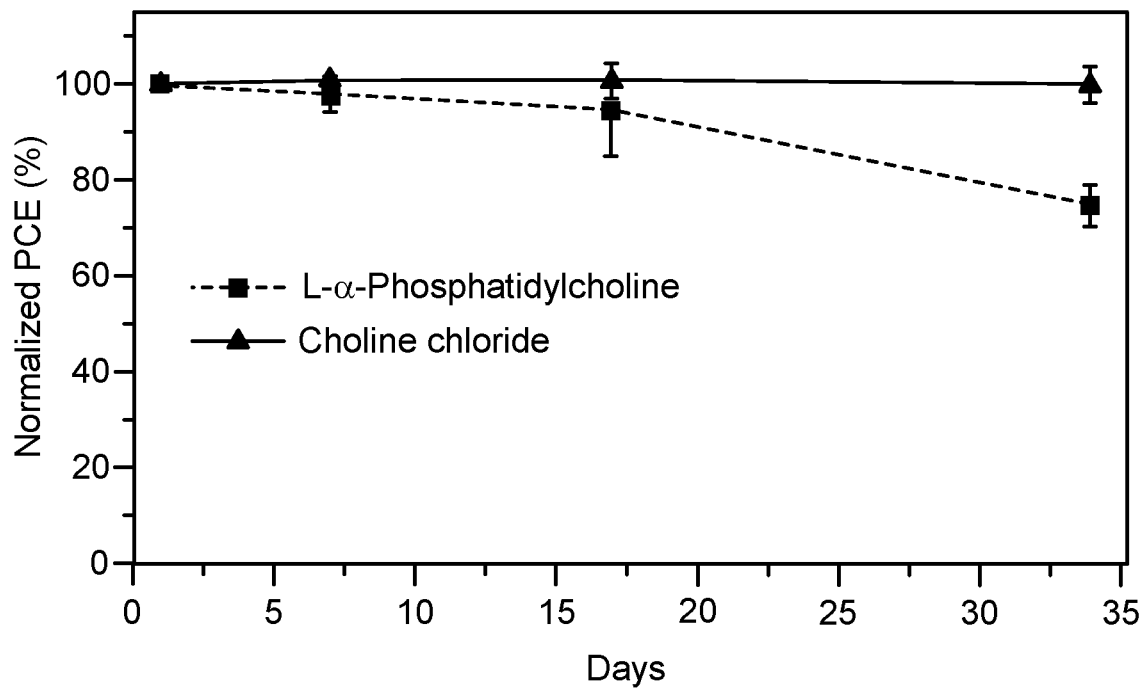
Figure 5:
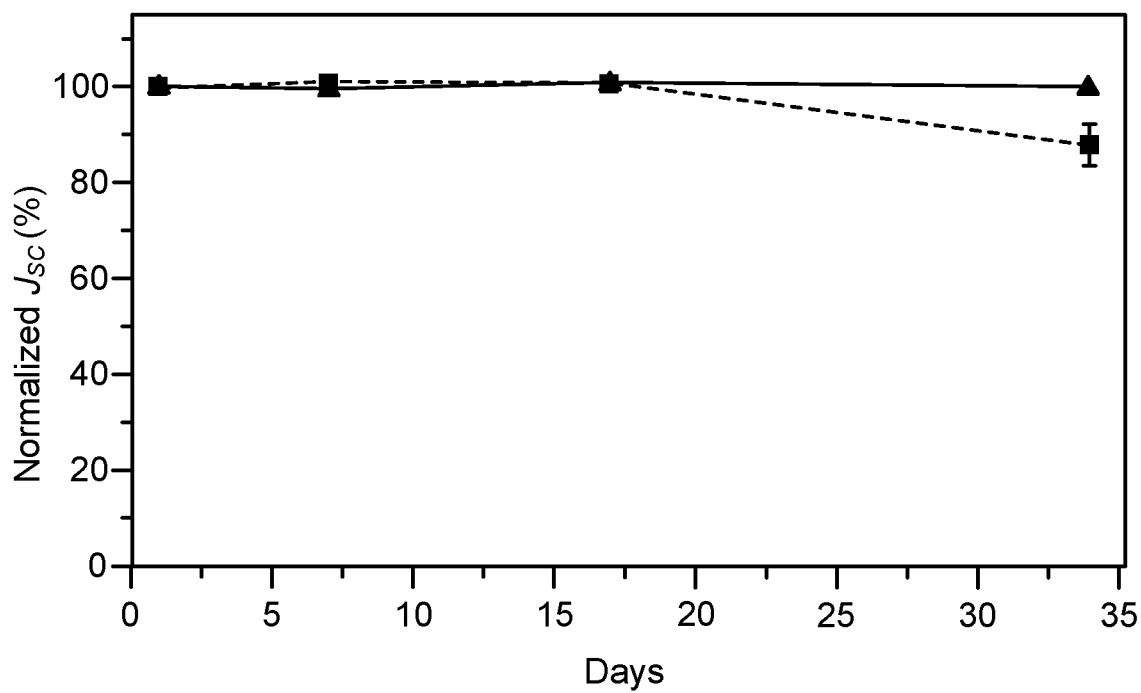
Figure 5:
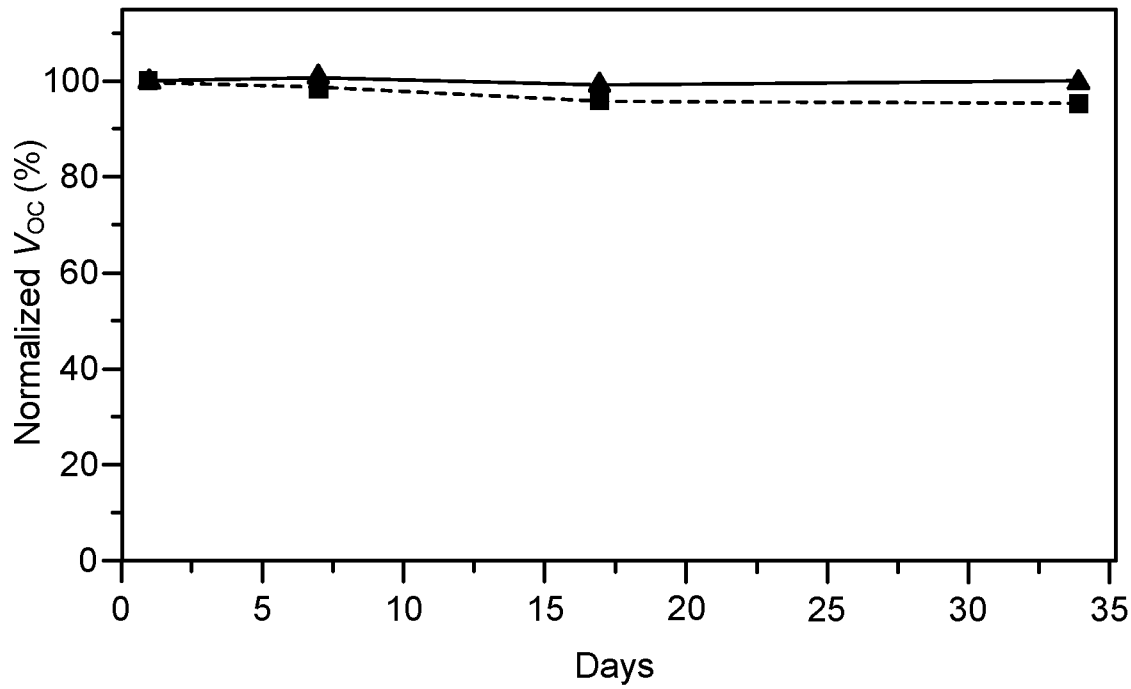
Figure 5:
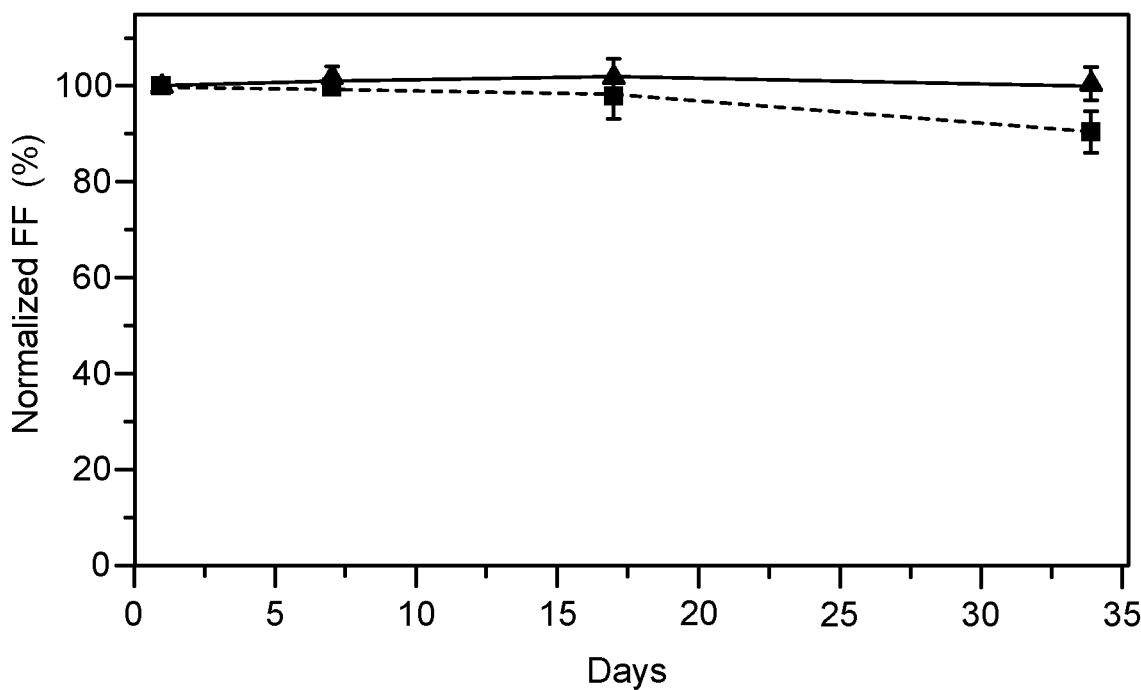
Figure 5:
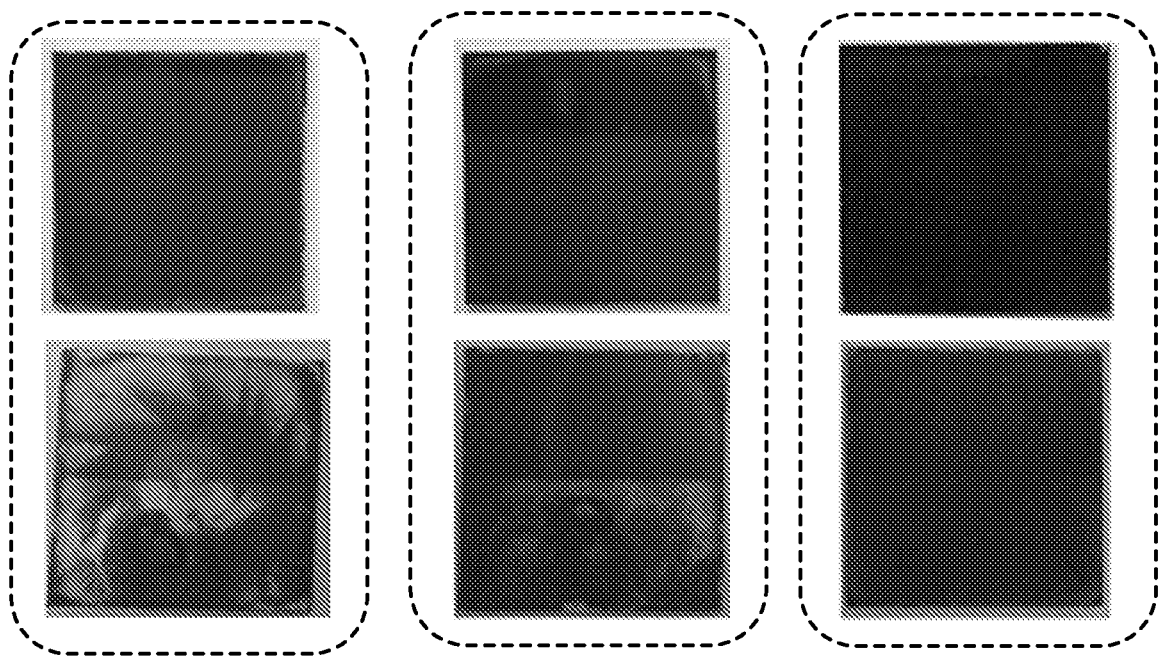

FIG. 5 shows stability assessment of perovskite solar cells with different passivation layers. Evolution of a) PCE, b) J$_{SC}$, c) V$_{OC}$, and d) FF relative to the initial parameters for the device over 35 days of storage in air. Each average (symbol) and standard deviation (error bar) was calculated from three solar cells. The initial efficiency is 19.5% and 20.1% for devices with L-α-Phosphatidylcholine, Choline chloride, respectively. FIG. 5e shows photographic images of the OIHP films with different treatments. The first and second rows show the images of the pristine films, with L-α-Phosphatidylcholine, and with Choline chloride from left to right, respectively, before after exposure to humidity of 90±5% for 2.5 h (the size of the film is 15 mm).

DETAILED DESCRIPTION

The history of power conversion efficiency (PCE) enhancement for thin-film and polycrystalline photovoltaic cells has witnessed the importance of reducing charge recombination loss both inside the photoactive layer and at the electrode contacts. Passivation of defects at the film surface becomes critical when the charge recombination inside the photoactive layer is negligible, which is the case for the organic-inorganic halide perovskite (OIHP) devices such as solar cells. Solution-processed OIHP devices embrace many intriguing optoelectronics attributes, such as strong light absorption, high charge carrier mobility, and long intrinsic carrier recombination lifetime. The insensitivity to point defects and easy crystallization of OIHP materials give rise to negligible charge recombination in perovskite polycrystalline thin films. However, the much shorter measured photoluminescence (PL) recombination lifetime of the polycrystalline films than the intrinsic carrier recombination lifetime from a single crystal interior indicates there is still high density of defects at the surface and grain boundaries of polycrystalline grains which are not benign electronically. These defects originate most likely from the low thermal stability, or low formation energy of OIHP materials containing organic components which tends to easily evaporate away from the surface during the thermal annealing process. These surface and grain boundary (GB) defects may not dramatically reduce device photocurrent output, because a portion of the trapped charges may still escape over a long time and be collected by the electrodes, as evidenced by the relative large short circuit current (J$_{SC}$) of many non-optimized devices, while they would significantly impact open circuit voltage (V$_{OC}$) of the devices due to their energy disorder and reduced carrier concentration which pull down the quasi-Fermi level splitting. In addition, these defects can cause other device instability issues, including ion migration and associated current hysteresis, and device degradation in ambient environment. A recent study of moisture dependent perovskite grain stability showed that the degradation of perovskite grains was initialized by the defective surface and GBs, while some single crystals with low surface defect density and no GBs could be stable in air for several years. The ionic defects (e.g., iodine or methylammonium vacancies) in the polycrystalline film have small migration activation energy (e.g., <0.1 eV) under 1 sun illumination. The defects could also initialize the permeation of moisture or oxygen into the perovskite films to accelerate the degradation of perovskite devices. Thus, it is desirable to electronically passivate the defects at the surface and GB to boost the PCE, and to heal these defects to prolong the durability of OIHP devices.

The ionic nature of OIHP materials imposes different requirements for the defects passivation with covalent-bonding semiconductors such as silicon (Si). The passivation of Si is mainly achieved by the elimination of the Si dangling bonds by formation of Si—O, Si—N or Si—H covalent bonds, which is however not applicable to strong ionic OIHPs. So far different passivation molecules have been reported to perform as electron donors or electron acceptors that can interact with the charged defects of OIHPs, and thereafter annihilate the relevant defect-induced charge traps. Lewis acids, such as phenyl-C61-butyric acid methyl ester (PCBM), as the good electron transporting materials could accept an electron from the negative charged Pb—I antisite defects, PbI$_3^-$ or under-coordinated halide ions and thus passivate the halide-induced deep traps. Lewis base molecules, such as thiophene or pyridine, usually perform as the electron donors which could bind to the positively charged, under-coordinated Pb$^{2+}$ ions. However, these molecules could only passivate one type of defects, either positive charged or negative charged defects, but not both together. The defects in OIHP materials are charged, either positively or negatively, and therefore the passivation of them should take the charge neutrality into consideration.

In certain embodiments, a system of materials, including quaternary ammonium halides (QAHs), are used to passivate both cationic and anionic defects in OIHP with its negative- and positive-charged components. The dual-modality passivation remarkably reduces the trap density and prolongs the carrier lifetime, which universally enhances the $V_{OC}$ of the OIHP planar heterojunction devices with different bandgaps and consequently increases the PCE by 10%-35%. This strategy can also enhance the stability of OIHPs devices, with almost no efficiency loss after 800 h of storage in ambient condition. The general rules for the passivation of ionic OIHPs include: the molecules or ions should have similar size with that of the ionic defects, and the molecules should have positive or negative charged components for self-assembling with the charged defects. These results highlight the importance of all-round passivation of charged ionic defects for improvement of the efficiency and durability of OIHPs devices.

Methods

Perovskite material layers are formed, e.g. a two-step method may be used to make $MAPbI_3$ films, e.g., fabricated by a thermal annealing-induced interdiffusion method. See, e.g., U.S. Pat. No. 9,391,287, which is hereby incorporated by reference in its entirety. Perovskite materials may also be formed using a one-step, solvent engineering method, e.g., as described in Jeon, N. J. et al., "Solvent Engineering for High performance Inorganic-Organic Hybrid Perovskite Solar Cells," *Nat. Mater.* 13, 897-903 (2014), which is incorporated by reference. The hole transport layer (HTL) poly(bis(4-phenyl)(2,4,6-trimethylphenyl)amine) (PTAA) with concentration of 2 mg/ml dissolved in toluene were spin coated at the speed of 6,000 r.p.m for 35 s and then annealed at 100° C. for 10 min. $PbI_2$ beads (99.999% trace metals basis) were purchased from Sigma-Aldrich. After dissolved in N,N-Dimethylformamide (DMF) at temperature of 100° C., around 50 µl of hot (~90° C.) 630 mg/ml $PbI_2$ DMF precursor solutions was quickly dropped onto the substrate and spin coated at the speed of 6,000 r.p.m. The as-fabricated $PbI_2$ films were dried and annealed at 90° C. for 10 min. After the $PbI_2$ films cooled to 70° C., 60 µl of 63 mg/ml methylammonium iodide (MAI) 2-propanol (IPA) precursor solution at the temperature of 70° C. was spun on the $PbI_2$ films. Subsequently, the sample was annealed at 70° C. for 20 min and 100° C. for 60 min. During the thermal annealing process, around 10 µl of DMF was added to the edge of the petri dish when the temperature reached 100° C.

The functional layer was applied to or disposed on the perovskite material layer (active layer). For example, the functional layer may be coated onto the perovskite substrate by spin coating, e.g., at 4,000 r.p.m. for 35 s, and annealing, e.g., at 100° C. for 30 min. The devices were finished by disposing or applying other layers thereto, e.g., thermally evaporating additional layers thereon, such as $C_{60}$ (23 nm), BCP (8 nm) and copper (80 nm) in sequential order.

Figure 1A:
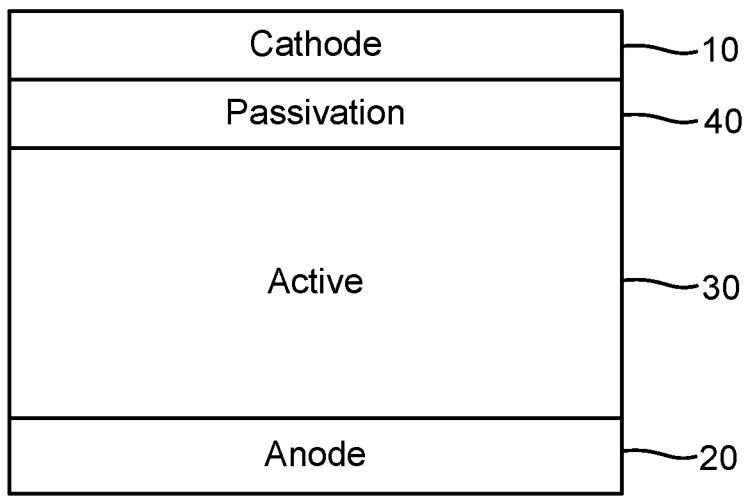
FIGS. 1a and 1b show embodiments of device structures of organic-inorganic halide perovskite (OIHP) devices.

FIG. 1a illustrates a device structure of an OTHP photodetector device 1 according to an embodiment. As shown, device 1 includes a cathode layer 10, an anode layer 20, and an active layer 30 disposed between the cathode layer 10 and the anode layer 20. Device 1 also includes a passivation layer 40 disposed directly on a surface of the active layer between the active layer 30 and the cathode layer 10. The passivation layer 30 includes a layer of material that passivates both cationic and anionic defects in the surface of the active layer as discussed herein. The passivation layer 40 should generally have a thickness of between about 1 nm and about 30 nm or more, depending on the specific application. The active layer 30 in an embodiment includes a layer of perovskite material, where the perovskite material includes organometal trihalide perovskite having the formula $ABX_3$, or $A_2BX_4$, wherein A is methylammonium ($CH_3NH_3^+$), formamidinium ($H_2NCHNH_2^+$), or an alkali-metal ion (e.g., $Cs^+$, $Rb^+$), B is a metal cation, and X is a halide anion (e.g., Cl, Br, or I), thiocyanate (SCN—) or a mixture thereof. For example, in an embodiment, active layer 30 may include an organometal trihalide perovskite having the formula $FA_xMA_{1-x}BX_3$ where FA is formamidinium ($H_2NCHNH_2^+$), and MA is methylammonium ($CH_3NH_3^+$) and x is a fractional value between (and including) 0 and 1. In an embodiment, X may be a mixture of two or more halides. For example, the active layer 40 may include $FA_xMA_{1-x}B(Br_{1-y}I_y)_3$ where y is a fractional value between (and including) 0 and 1 and where x may have the same value of y or a different value. Specific examples might include $FA_{0.85}MA_{0.15}B(Br_{0.15}I_{0.85})_3$, $FA_{0.83}MA_{0.17}B(Br_{0.17}I_{0.83})_3$, and $FA_{0.83}MA_{0.17}B(Br_{0.4}I_{0.6})_3$. The active layer 30 should generally have a thickness of between about 1 nm and about 10 µm depending on the specific application. For example, for typical photodetection applications, a perovskite active layer will have a thickness of about 100 nm to about 2 µm. Additionally, the active layer 30 should generally have an active device area e.g., the cross-sectional light-capturing area, of between about 0.04 $mm^2$ to about 7 $mm^2$, where a smaller active area may be more desirable as will be discussed below.

The anode layer 20 and the cathode layer 10 generally include conductive materials suited for the particular application. Useful materials for the anode layer 20 includes indium tin oxide (ITO), fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene. Useful materials for the cathode layer include copper, aluminum, calcium, magnesium, lithium, sodium, potassium, strontium, cesium, barium, iron, cobalt, nickel, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, or a combination of at least two of the above materials.

Figure 1B:
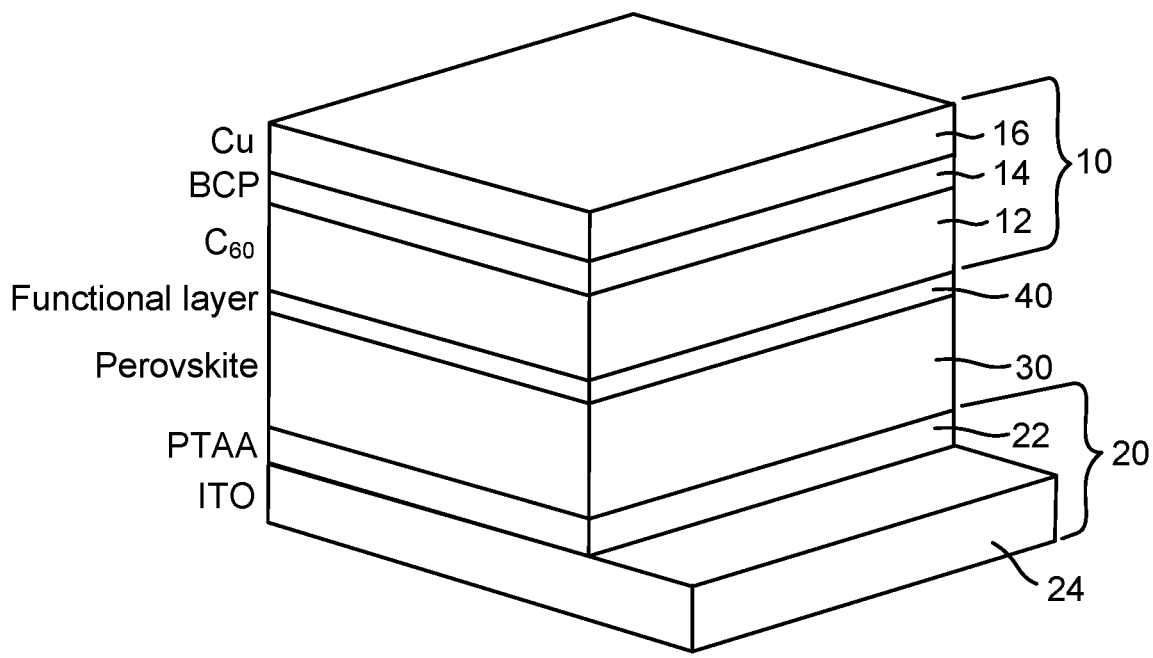

FIG. 1b illustrates a perspective view of a specific device structure of an OIHP photodetector device 100 according to an embodiment. The specific structure of device 100 is composed of anode 20 including conductive layer 24: e.g., indium tin oxide (ITO) and second buffer layer 22: e.g., poly(bis(4-phenyl)(2,4,6-trimethylphenyl)amine (PTAA)/active layer 30: e.g., $CH_3NH_3PbI_3$(MAPbI_3)/functional layer 40/and cathode layer 10 including electron extraction layer 12: e.g., fullerene, $C_{60}$, first buffer layer 14: e.g., 2,9-dimethyl-4,7-diphenyl-1,10-phenanthroline (BCP), and conductive material layer 16: e.g., Copper (Cu). As shown, the electron extraction layer 12 includes only fullerene ($C_{60}$), but may include a combination of material layers, such as a phenyl-C61-butyric acid methyl ester ($PC_{61}BM$)/$C_{60}$ double layer. In this embodiment, the functional layer 40 is disposed directly on the organic-inorganic halide perovskite (OIHP) film 30 to passivate of the ionic defects of the perovskite film to enhance both the performance and the stability of the OIHP device.

In device 100, cathode layer 10 further includes an electron extraction layer 12 disposed between the cathode material layer 16 and the active layer 30. The electron extraction layer 12, in one embodiment, includes a layer of fullerene such as $C_{60}$ directly disposed on the passivation layer 40.

Cathode layer 10 optionally includes a first charge transport layer 14 disposed between the electron extraction layer 12 and the cathode material layer 16. Anode layer 20 optionally includes a second charge transport layer 22 disposed between the active layer 30 and the anode material layer 24. When present, the first charge transport layer 14 should have a higher electron conductivity than the second charge transport layer 22, and the second charge transport layer 22 should have a higher hole conductivity than the first charge transport layer 14, e.g., the first transport layer 14 acts as an electron transport layer (ETL) and the second charge transfer layer 22 acts as a hole transport layer (HTL).

In certain embodiments, the first charge transport layer 14 includes at least one of $C_{60}$, a fullerene, a fullerene-derivative, LiF, CsF, $LiCoO_2$, $CS_2CO_3$, TiOx, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SWCNT), poly(ethylene glycol) (PEG), Polyethylenimine (PEI), poly(dimethylsiloxaneblock-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBTI5), fluorene alternating and random copolymer bearing cationic groups in the alkyl side chains (PFPNBr), or poly(ethylene oxide) (PEO). Representative fullerene groups include C60, C70, C71, C76, C78, C80, C82, C84, and C92. C60 derivative is at least one C60 derivative selected from the group consisting of C60PCBM, bis-adduct C60PCBM, tris-adduct C60PCBM, tetra-adduct C60PCBM, penta-adduct C60PCBM, hexa-adduct C60PCBM, C60ThCBM, bis-adduct C60ThCBM, tris-adduct C60ThCBM, tetra-adduct C60ThCBM, penta-adduct C60ThCBM, hexa-adduct C60ThCBM, C60 mono-indene adduct, C60 bis-indene adduct, C60 tris-indene adduct, C60 tetra-indene adduct, C60 penta-indene adduct, C60 hexa-indene adduct, C60 mono-quinodimethane adduct, C60 bis-quinodimethane adduct, C60 tris-quinodimethane adduct, C60 tetra-quinodimethane adduct, C60 penta-quinodimethane adduct, C60 hexa-quinodimethane adduct, C60 mono-(dimethyl acetylenedicarboxylate) adduct, C60 bis-(dimethyl acetylenedicarboxylate) adduct, C60 tris-(dimethyl acetylenedicarboxylate) adduct, C60 tetra-(dimethyl acetylenedicarboxylate) adduct, C60 penta-(dimethyl acetylenedicarboxylate) adduct, C60 hexa-(dimethyl acetylenedicarboxylate) adduct, and a mixture thereof. C70 and C84 derivatives include PC70BM, IC70BA, and PC84BM.

In certain embodiments, the second charge transport layer 22 includes at least one of poly(3,4-ethylenedioxithiophene) (PEDOT) doped with poly(styrene sulfonicacid) (PSS), 4,4'bis[(ptrichlorosilylpropylphenyl)phenylamino]biphenyl (TPD-Si2), poly(3-hexyl-2,5-thienylene vinylene) (P3HTV) and C60, copper phthalocyanine (CuPc), poly[3,4-(1hydroxymethyl) ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctylfluorene)-co-N-(4-(1-methylpropyl)phenyl)diphenylamine] (PFT), 4,4'bis[(p-trichlorosilylpropylphenyl) phenylamino] biphenyl (TSPP), 5,5'-bis[(p-trichlorosilyl-propylphenyl) phenylamino]-2,20-bithiophene (TSPT), N-propyltriethoxysilane, 3,3,3-trifluoropropyltrichlorosilane or 3-aminopropyltriethoxysilanePoly[bis(4-phenyl)(2, 4,6 trimethylphenyl)amine] (PTAA), V2O5, VOx, MoO3, WO3, ReO3, NiOx, AgOx/PEDOT:PSS, Cu2O, CuSCN/P3HT, or Au nanoparticles.

Functional layer 40 may include one or more different structured molecules with varied functional groups, including, for example, phenyl-C61-butyric acid methyl ester (PCBM), L-α-Phosphatidylcholine, Tween-20, Polyethylene-block-poly(ethylene glycol) (PE-PEG), Choline chloride, and/or Choline iodide. In certain embodiments, the functional layer includes a QAH having a structure of $NR_4^+X^-$, where R is an alkyl or aryl group and X is a halide.

FIG. 3a shows the current density-voltage (J-V) curves of the $MAPbI_3$ (active layer) devices with deposition of different functional/passivation layers. The control device with PCBM layer showed typical performance with a short circuit current density ($J_{SC}$) of 22.5 mAcm$^{-2}$, a $V_{OC}$ of 1.04 V, a fill factor (FF) of 73.0%, and a PCE of 17.1%. Compared to the device with PCBM layers, the performances of the $MAPbI_3$ devices with Tween, and PE-PEG buffer layers were even worse with maximum PCE between 13.6% and 15.5%, even after optimization of the concentration of Tween and PE-PEG solution. It indicates that Tween and PE-PEG cannot passivate the surface defects on $MAPbI_3$. In striking contrast, the devices with L-α-Phosphatidylcholine layer showed a significantly improved performance with an average $J_{SC}$ of 22.7 mA cm$^{-2}$, $V_{OC}$ of 1.08 V, FF of 80.0%, and PCE of 19.6%. The performance enhancement and hysteresis-free behavior were tentatively attributed to the passivation effect of L-α-Phosphatidylcholine molecules.

Figure 2:
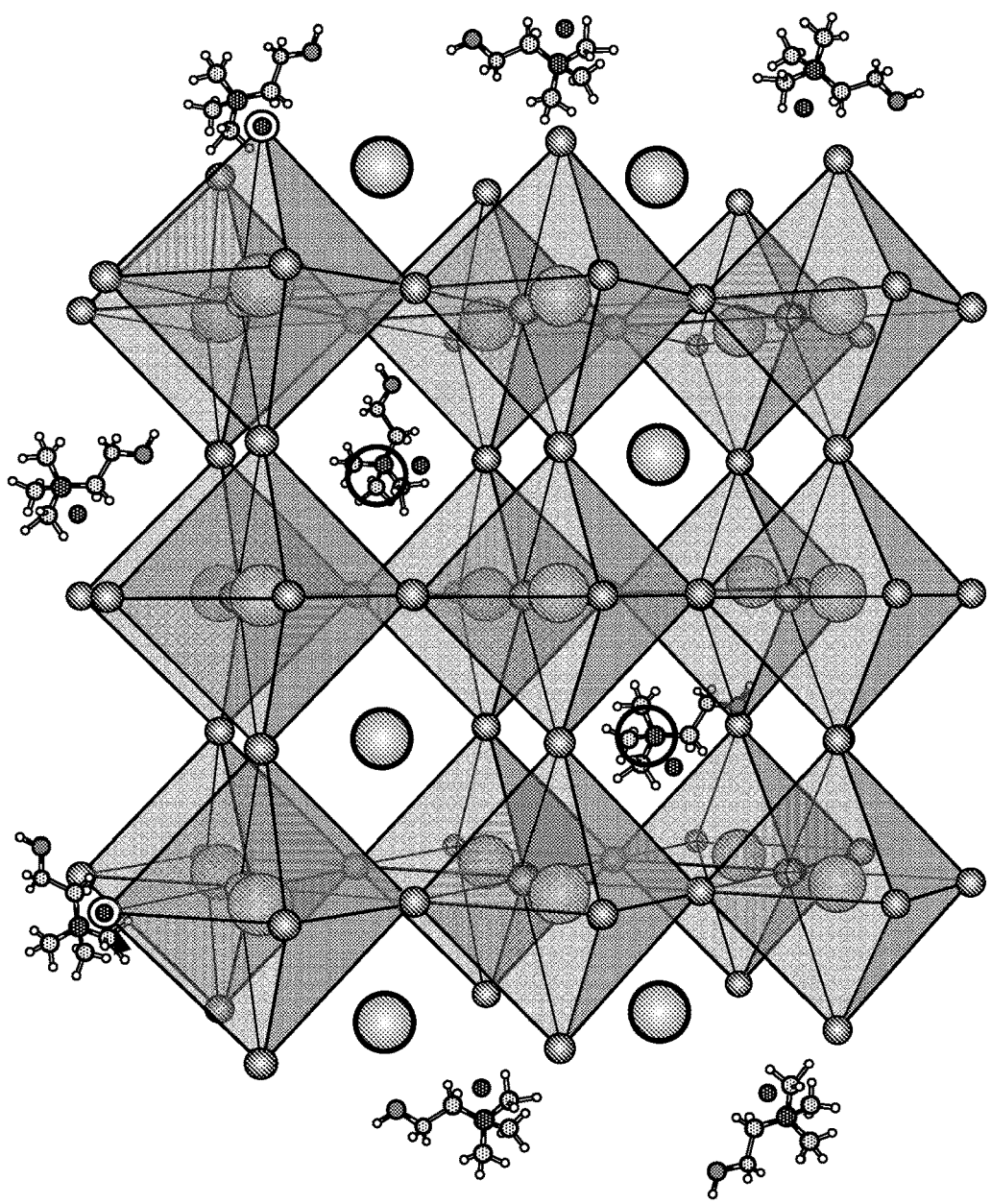
FIG. 2 shows the passivation mechanism by quaternary ammonium halides (QAHs). The quaternary ammonium ions are expected to only passivate MA$^+$ vacancies by occupying cuboctahedral sites to compensate the MA$^+$ loss on the film surfaces, and the halide vacancies are compensated by additional halide ions from QAHs.

In comparison to Tween and PE-PEG, L-α-Phosphatidylcholine has the same long alkyl chain, while the difference is that L-α-Phosphatidylcholine has a choline phosphate zwitterion structure. The zwitterion structure with the choline group most likely passivates $MAPbI_3$. To verify, two other choline zwitterion molecules, also known as quaternary ammonium halides (QAHs), including choline iodide and choline chloride which have no long alkyl chain, were used as the interfacial layer. As shown in FIG. 3b, the $V_{OC}$ of the perovskite devices was significantly increased by choline iodide and choline chloride as passivation layers without sacrificing the $J_{SC}$ and FF of the devices, which confirmed the speculation. The devices with choline iodide and choline chloride showed higher $V_{OC}$ of 1.14 and 1.15 V. Consequently, PCEs of the $CH_3NH_3PbI_3$ devices with choline iodide and choline chloride passivation layers were increased to 20.1%, and 20.0%, respectively. FIG. 3c shows the $V_{OC}$ distribution of the devices with different passivation layers. The average $V_{OC}$ values are 1.04, 1.09, 1.13, and 1.13 V for the statistic $V_{OC}$ of the devices with PCBM, L-α-Phosphatidylcholine, choline iodide and choline chloride, respectively. The larger average $V_{OC}$ of the devices passivated by QAHs than by L-α-Phosphatidylcholine indicates there is an additional passivation effect from the halide ions, because both of them have the quaternary ammonium component. There are both positively-charged cationic and negatively-charged anionic defects in OIHPs, such as I$^-$ and MA$^+$ vacancies, respectively, while quaternary ammonium ions are expected to only passivate MA$^+$ vacancies by occupying cuboctahedral sites to compensate the MA$^+$ loss on the film surfaces, as illustrated in FIG. 2. Loss of halide ions by the evaporation of MAI during thermal annealing process needs to be compensated by additional halide ions. Therefore, the dual passivation effect is critical in achieving the high efficiency devices according to various embodiments herein. The notable better passivation effect of choline chloride than choline iodide can be explained by the stronger Pb—Cl bonding than Pb—I bond, and small amount of Cl addition has been broadly reported to enhance the charge recombination lifetime in MAPbI$_3$. Based on the mechanism of passivation presented herein, any Zwitterion molecular structure should have a good passivation effect, because they have both negative and positive electric charges. A Zwitterion molecule may passivate both cationic and anion defects if the spacing of these defects is similar to or the same as the size of the Zwitterion molecule. However, the defects at the surface of perovskite films may have a very complicated distribution and compositions. The positive and negative charge defects may distribute away from each other, and their ratio may not be 1:1, because the perovskite film surface does not necessarily reach thermal dynamic stable states right after annealing processing, and the surfaces defects may pair up with bulk defects. In this context, the QAH molecule with separated positive and negative ions have the advantage of self-adaptive selection of defects with opposite charges for passivation, which is not limited by the complicated surface defect composition or distribution.

To further analyze the passivation effect of the QAH, measurements of the trap density of states (tDOS) were made for the devices fabricated by two-step processed MAPbI$_3$ perovskite with choline chloride or PCBM passivation. The trap densities were extracted using thermal admittance spectroscopy (TAS) analysis, which is a well-established and effective technique to characterize both shallow and deep defects of thin film and organic solar cells. FIG. 4 shows that the device with choline chloride layers had overall the lowest tDOS over the whole trap depth region. The device with choline chloride layer had low tDOS in deeper trap region (0.40-0.52 eV) which were assigned to defects at the film surface. In addition, the density of shallower trap states (0.35-0.40 eV), which was assigned to traps at grain boundaries, in the choline chloride passivated devices was about three times smaller than in the PCBM passivated devices. This indicates that choline chloride may also diffuse into grain boundaries to passivate them. The better passivation effect of choline chloride than PCBM verifies that both cationic and anionic defects in OIHPs need to be considered in passivation techniques.

The stability of OIHPs devices in the ambient condition is challenged by their sensitivity to moisture and oxygen due to the hydroscopic nature of the OIHP films. Recent studies revealed that the degradation of perovskite films was generally initialized at the defects sites at the film surface and grain boundaries where the molecules have highest activity and diffusivity. The passivation may also enhance the stability of the perovskite films in ambient environment, because the healing of the defective sites on the film surface may inhibit the permeation of moisture and oxygen through the defects. To verify this, the stability of OIHPs devices with choline chloride and L-α-Phosphatidylcholine functional layers were monitored by placing the unencapsulated devices in ambient atmosphere at room temperature and relative humidity of 50%-85%; the device performance is summarized in FIG. 5. The devices with choline chloride layers retained almost 100% of the initial PCEs after storage in the ambient condition for over one month. Interestingly, the V$_{OC}$ of the devices increased during the first 5 days of storage in both types of devices with choline chloride passivation. This phenomenon may be caused by the additional passivation effect at the anode side by the diffusion of sodium ions into the perovskite films. The L-α-Phosphatidylcholine modified devices showed inferior performance, 30% loss of the initial PCE after 800 h storage in the ambient condition, despite that the long hydrophobic alkane tails could hinder the permeation of moisture. The difference in stability of the devices with two passivation layers highlighted the importance of healing both types of defects. The humidity stability test for the bare OIHP films (FIG. 5e) shows that the films with QAHs have much slower degradation rate than the control films without QAHs when they were exposed to the humidity of 90±5% for same time intervals. This result confirmed that the healing of the defect sites by choline chloride effectively improves the moisture stability of OIHPs films.

Based on the passivation mechanism, there are at least two kinds of molecules that have the desired passivation effect. A first kind of molecule includes molecules that have a functional group (ammonium (—NH$_2$), halides, small atomic radius metal ions) which have the similar size to the corresponding vacancy, and thereafter fill these vacancies. The following molecules are expected to have the passivation effect because of this mechanism: Guanidine thiocyanate, aniline, benzylamine, and phenethylamine, Poly(ethylene glycol) bis(amine), (2-Methylbutyl)amine, 4-Pentyn-1-amine, N-Isopropylpyridin-2-amine, isochroman-6-amine, 2-phenylbutan-1-amine, 1-benzofuran-5-amine, 2-methylcyclopropan-1-amine, 3-Buten-1-amine, 1,4-Benzodioxan-6-amine, 5-methylpyrimidin-2-amine, 1-Methyl-1H-pyrazol-4-amine, 2,4,6-Trifluorobenzyl amine, 1,6-naphthyridin-2-amine, 1,2-benzisoxazol-3-amine, 1-Cyclohexyl-1H-pyrazol-5-amine, Methylammonium iodide, Methylammonium bromide, Methylammonium chloride, phenylethylammonium Iodide, phenylethylammonium bromide, phenylethylammonium chloride, n-butylammonium Iodide, n-butylammonium bromide, n-butylammonium chloride, NaCl, KCl, Ki, NaI, CsCl, CsI, RbCl, RbI, CoI$_2$, CoCl$_2$, SrCl$_2$, SrI$_2$. A second kind of molecule includes molecules that have the Zwitterionic structure which is composed of positive and negative charged components that could self-assemble with different charged defects, resulting in the healing of the charged defects. The following molecules are expected to have the passivation effect because of the above mechanism: Choline chloride, Choline iodide, Choline bromide, L-α-Phosphatidylcholine, Betaine, Tetrabutylammonium iodide, 1-Ethyl-3-methylimidazolium iodide, Tetrabutylammonium phosphate monobasic, 3-(4-tert-Butyl-1-pyridinio)-1-propanesulfonate, 3-(1-Pyridinio)-1-propanesulfonate, 3-(Benzyldimethylammonio)propanesulfonate, 3-(Decyldimethylammonio)-propane-sulfonate inner salt, Guanidinium iodide, Guanidinium thiocyanate, Guanidinium chloride. The functional molecules having at least one feature of the suitable size or Zwitterionic structure have the passivation effect on the OIHPs devices.

The use of the terms "a" and "an" and "the" and "at least one" and similar referents in the context of describing the disclosed subject matter (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or example language (e.g., "such as") provided herein, is intended merely to better illuminate the disclosed subject matter and does not pose a limitation on the scope of the invention unless otherwise claimed. No language in the specification should be construed as indicating any non-claimed element as essential to the practice of the invention.

Certain embodiments are described herein. Variations of those embodiments may become apparent to those of ordinary skill in the art upon reading the foregoing description. The inventors expect skilled artisans to employ such variations as appropriate, and the inventors intend for the embodiments to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A semiconductor device, comprising:
a cathode layer;
an anode layer;
an active layer disposed between the cathode layer and the anode layer, where the active layer includes a perovskite layer; and
a passivation layer disposed directly on a surface of the active layer between the cathode layer and the active layer, the passivation layer comprising a layer of material that passivates both cationic and anionic defects in the surface of the active layer;
wherein the layer of material comprises a quaternary ammonium halide (QAH) or a switterion molecule.

2. The semiconductor device of claim 1, wherein the perovskite layer includes organometal trihalide perovskite having the formula $ABX_3$, or $A_2BX_4$, wherein A is methylammonium ($CH_3NH_3^+$), formamidinium ($H_2NCHNH_2^+$), or an alkali-metal ion, B is a metal cation, and X is a halide anion, thiocyanate (SCN—) or a mixture thereof.

3. The semiconductor device of claim 1, wherein the layer of material comprises a quaternary ammonium halide (QAH).

4. The semiconductor device of claim 1, wherein the layer of material comprises a zwitterion molecule.

5. The semiconductor device of claim 1, wherein the layer of material comprises functional molecules selected from the group consisting of: Choline chloride, Choline iodide, Choline bromide, L-α-Phosphatidylcholine, Betaine, Tetrabutylammonium iodide, 1-Ethyl-3-methylimidazolium iodide, Tetrabutylammonium phosphate monobasic, 3-(4-tert-Butyl-1-pyridinio)-1-propanesulfonate, 3-(1-Pyridinio)-1-propanesulfonate, 3-(Benzyldimethylammonio)propanesulfonate, 3-(Decyldimethylammonio)-propane-sulfonate inner salt, Guanidinium iodide, Guanidinium thiocyanate, and Guanidinium chloride.

6. The semiconductor device of claim 1, further comprising:
a first carrier transport layer disposed between the passivation layer and the cathode; and
a second carrier transport layer disposed between the active layer and the anode, the first carrier transport layer having a higher electron conductivity than the second carrier transport layer, the second carrier transport layer having a higher hole conductivity than the first carrier transport layer.

7. The semiconductor device of claim 1, further comprising a fullerene layer disposed on the passivation layer between the passivation layer and the first carrier transport layer.

8. The semiconductor device of claim 1, wherein the anode layer includes at least one of indium tin oxide (ITO), fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

9. The semiconductor device of claim 1, wherein the cathode layer includes at least one of copper, aluminum, calcium, magnesium, lithium, sodium, potassium, strontium, cesium, barium, iron, cobalt, nickel, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, or a combination of at least two of the above materials.

10. The semiconductor device of claim 1, wherein the layer of material comprises choline.

11. A semiconductor device, comprising:
a cathode layer;
an anode layer;
an active layer disposed between the cathode layer and the anode layer, where the active layer includes an organometal trihalide perovskite having the formula $ABX_3$, or $A_2BX_4$, wherein A is methylammonium ($CH_3NH_3^+$), an alkali metal ion or formamidinium ($H_2NCHNH_2^+$), B is a metal cation, and X is a halide anion, thiocyanate (SCN—) or a mixture thereof;
a passivation layer disposed directly on a surface of the active layer between the cathode layer and the active layer, the passivation layer comprising a layer of material that passivates both cationic and anionic defects in the surface of the active layer; wherein the layer of material comprises a quaternary ammonium halide (QAH) or a zwitterion molecule;
an electron extraction layer disposed directly on the passivation layer between the passivation layer and the cathode layer, the electron extraction layer comprising a layer of $C_{60}$;
a first carrier transport layer comprising bathocuproine (BCP) and disposed between the electron extraction layer and the cathode; and
a second carrier transport layer comprising Poly[bis(4-phenyl)(2,4,6-trimethylphenyl)amine] (PTAA) and disposed between the active layer and the anode.

12. The semiconductor device of claim 11, wherein the layer of material comprises a quaternary ammonium halide (QAH).

13. The semiconductor device of claim 11, wherein the layer of material comprises a zwitterion molecule.

* * * * *